(12) United States Patent
Lim

(10) Patent No.: US 9,443,618 B2
(45) Date of Patent: Sep. 13, 2016

(54) SEMICONDUCTOR MEMORY DEVICE MAPPING EXTERNAL ADDRESS AS INTERNAL ADDRESS WHEREIN INTERNAL ADDRESSES OF SPARE CELLS OF TWO BLOCKS DIFFER BY UPPER MOST BIT AND INTERNAL ADDRESSES OF MAIN CELLS OF TWO BLOCKS DIFFER BY UPPER MOST BIT AND THE INTERNAL ADDRESSES OF MAIN CELL AND SPARE CELL OF EACH BLOCK DIFFER BY ONE BIT AND OPERATING METHOD FOR THE SAME

(71) Applicant: SK hynix Inc., Gyeonggi-do (KR)
(72) Inventor: Sang-Oh Lim, Gyeonggi-do (KR)
(73) Assignee: SK Hynix Inc., Gyeonggi-do (KR)
( * ) Notice: Subject to any disclaimer, the term of this patent is extended or adjusted under 35 U.S.C. 154(b) by 189 days.
(21) Appl. No.: 13/829,548
(22) Filed: Mar. 14, 2013

(65) Prior Publication Data
US 2014/0189283 A1    Jul. 3, 2014

(30) Foreign Application Priority Data
Dec. 27, 2012   (KR) .......................... 10-2012-0155059

(51) Int. Cl.
*G11C 29/00*         (2006.01)
(52) U.S. Cl.
CPC ............... *G11C 29/84* (2013.01); *G11C 29/82* (2013.01)
(58) Field of Classification Search
None
See application file for complete search history.

(56) References Cited
U.S. PATENT DOCUMENTS

| | | | | |
|---|---|---|---|---|
| 5,129,088 A * | 7/1992 | Auslander et al. | | 711/1 |
| 5,675,770 A * | 10/1997 | Ogata | | 711/173 |
| 5,943,693 A * | 8/1999 | Barth | | 711/220 |
| 5,954,812 A * | 9/1999 | Shiell et al. | | 712/39 |
| 6,161,195 A * | 12/2000 | Konishi | | G11C 29/765 714/5.1 |
| 6,233,667 B1 * | 5/2001 | Shaylor et al. | | 711/203 |
| 6,310,824 B1 * | 10/2001 | Schoniger | | G11C 7/1018 365/230.04 |
| 6,330,368 B1 * | 12/2001 | Ulichney | | H04N 1/4051 345/596 |
| 7,278,008 B1 * | 10/2007 | Case et al. | | 711/209 |
| 7,519,747 B1 * | 4/2009 | Cory et al. | | 710/53 |
| 2002/0186588 A1 | 12/2002 | Cho et al. | | |
| 2003/0137909 A1 * | 7/2003 | Ito et al. | | 369/47.14 |
| 2003/0156454 A1 * | 8/2003 | Wei et al. | | 365/185.17 |
| 2004/0151101 A1 * | 8/2004 | Park et al. | | 369/53.24 |
| 2004/0160799 A1 * | 8/2004 | Park | | G11B 20/1883 365/145 |
| 2004/0243740 A1 * | 12/2004 | Yamagishi | | 710/22 |
| 2005/0097406 A1 * | 5/2005 | Brebisson | | 714/52 |
| 2007/0279984 A1 * | 12/2007 | Mori et al. | | 365/185.09 |
| 2007/0283123 A1 * | 12/2007 | Vick et al. | | 711/207 |

FOREIGN PATENT DOCUMENTS

KR    1020110001571    1/2011

* cited by examiner

*Primary Examiner* — Midys Rojas
*Assistant Examiner* — Chie Yew
(74) *Attorney, Agent, or Firm* — IP & T Group LLP

(57) ABSTRACT

Provided is a semiconductor memory device that may efficiently map an internal address used inside the semiconductor memory device in response to an external address that is applied from the outside of the semiconductor memory device. The semiconductor memory device may include a memory cell array configured to include a first main cell array, a first spare cell array, a second main cell array, and a second spare cell array each of which has internal cells that are selected in response to an internal address, and an address mapping unit configured to map external address as the internal address when the external address designates the first main and spare cell arrays, and to operate calculation with a given value and the external address and to map the calculation result value as the internal address when the external address designates the second main and spare cell arrays.

14 Claims, 5 Drawing Sheets

US 9,443,618 B2

SEMICONDUCTOR MEMORY DEVICE MAPPING EXTERNAL ADDRESS AS INTERNAL ADDRESS WHEREIN INTERNAL ADDRESSES OF SPARE CELLS OF TWO BLOCKS DIFFER BY UPPER MOST BIT AND INTERNAL ADDRESSES OF MAIN CELLS OF TWO BLOCKS DIFFER BY UPPER MOST BIT AND THE INTERNAL ADDRESSES OF MAIN CELL AND SPARE CELL OF EACH BLOCK DIFFER BY ONE BIT AND OPERATING METHOD FOR THE SAME

CROSS-REFERENCE TO RELATED APPLICATIONS

The present application claims priority of Korean Patent Application No. 10-2012-0155059, filed on Dec. 27, 2012, which is incorporated herein by reference in its entirety.

BACKGROUND

1. Field

Exemplary embodiments of the present invention relate to a semiconductor designing technology, and more particularly, to a semiconductor memory device that may efficiently map an internal address internally used in the memory cell array of the semiconductor memory device in response to an external address that is applied from the outside of the semiconductor memory device.

2. Description of the Related Art

Semiconductor memory devices are generally divided into volatile semiconductor memory devices and non-volatile semiconductor memory devices. Recently, there are increasing demands for the non-volatile memory devices that are capable of performing program and erase operations without a refresh operation, which is an operation of reprogramming a data at a predetermined cycle.

FIG. 1 illustrates a structure of a memory cell array in a non-volatile memory device according to a prior art where pages are divided into even pages and odd pages and into main pages and spare pages according to column addresses.

Referring to FIG. 1, the memory cell array of the conventional non-volatile memory device includes even pages and odd pages that are decided according to a column address, and each page is divided into a main memory array page and a spare memory array page.

In other words, the memory cell array of the conventional non-volatile memory device includes a main even page MAIN_EVEN (1), a main odd page MAIN_ODD (2), a spare even page SPARE_EVEN (3), and a spare odd page SPARE_ODD (4) that are sequentially disposed according to column addresses.

FIG. 1 illustrates an example of such memory cell array. The entire size of the exemplary memory cell array in a column direction is 18K and the main pages occupy 16K out of the entire size while the spare pages occupy 2K.

According to the prior art, the Initial column addresses of the main even page MAIN_EVEN (1), the main odd page MAIN_ODD (2), the spare even page SPARE_EVEN (3), and the spare odd page SPARE_ODD (4) are '0 0000 00 0000 0000', '0 1000 00 0000 0000', '1 0000 00 0000 0000', and '1 0001 00 0000 0000', respectively.

In short, the pages of the memory cell array are sequentially disposed in the order of the main even page MAIN_EVEN (1), the main odd page MAIN_ODD (2), the spare even page SPARE_EVEN (3), and the spare odd page SPARE_ODD (4). According to the structure of the prior art, it is possible to perform common column address decoding operation with differentiation of the main even page MAIN_EVEN (1) and the main odd page MAIN_ODD (2) by the upper second bit ('0' or '1') and with differentiation of the spare even page SPARE_EVEN (3) and the spare odd page SPARE_ODD (4) by the upper fifth bit ('0' or '1').

Meanwhile, high-speed interface of a non-volatile memory device is becoming more significant. For the high-speed interface, it is essential to realize a 'half page read operation' to reduce a read time tR during an All Bit Line (ABL) read operation. During the half page read operation, the main even page MAIN_EVEN (1) and the spare even page SPARE_EVEN (3) should be sequentially read or the main odd page MAIN_ODD (2) and the spare odd page SPARE_ODD (4) should be sequentially read.

However, according to the structure of the prior art shown in FIG. 1, where the pages of the memory cell array are sequentially disposed in the order of the main even page MAIN_EVEN (1), the main odd page MAIN_ODD (2), the spare even page SPARE_EVEN (3), and the spare odd page SPARE_ODD (4), it is hard to perform the 'half page read operation' in a burst mode. When data are inputted/outputted in the burst mode, that is, when data are inputted/outputted through sequential change of column addresses, the spare even page SPARE_EVEN (3) cannot be accessed right after access of the main even page MAIN_EVEN (1) because of disposition of the main odd page MAIN_ODD (2) between the main even page MAIN_EVEN (1) and the spare even page SPARE_EVEN (3). In other words, it is hard to realize the half page read operation according to the structure of the prior art shown in FIG. 1 in the burst mode. Herein, the burst mode means a mode in which an operation of sequential data input/output is performed with reception of an initial column address from the outside of the semiconductor memory device, internal counting of an address value sequentially starting from the received initial column address, and access of the memory cell of internally counted addresses, which are sequential.

In order to realize the half page read operation with the structure of the prior art shown in FIG. 1, when accessing the spare even page SPARE_EVEN (3) or the spare odd page SPARE_ODD (4), the semiconductor memory device has to get out of the burst mode and then receive a column address for the page from the outside of the semiconductor device, which means turning to an operation of random data input/output and causing an increase in time for the half page read operation. Thus, great deterioration of the overall performance of the non-volatile semiconductor memory device may occur.

FIG. 2 illustrates a structure of another conventional memory cell array in a non-volatile memory device where pages are divided into even pages and odd pages and into main pages and spare pages according to column addresses. The structure of a memory cell array shown in FIG. 2 is suggested to alleviate the concern present in the conventional non-volatile memory device shown in FIG. 1.

Referring to FIG. 2, just as illustrated in FIG. 1, the memory cell array includes even pages and odd pages according to column addresses, and each page is divided into a main memory array page and a spare memory array page.

The pages of the memory cell array shown in FIG. 2 are sequentially disposed in the order of a main even page MAIN_EVEN (1), a spare even page SPARE_EVEN (2), a main odd page MAIN_ODD (3), and a spare odd page SPARE_ODD (4).

In other words, the non-volatile memory device illustrated in FIG. 2 defines the page sequence according to column addresses in the memory cell array to realize the half page read operation in the burst mode. Therefore, the non-volatile memory device illustrated in FIG. 2 is capable of sequentially accessing the spare even page SPARE_EVEN (2) right after access of the main even page MAIN_EVEN (1), and capable of sequentially accessing the spare odd page SPARE_ODD (4) right after access of the main odd page MAIN_ODD (3) for the half page read operation in the burst mode.

According to the prior art shown in FIG. 2, however, the column address scheme becomes different as well, and it is impossible to perform the common column address decoding operation of the prior art shown in FIG. 1. For the convenience of explanation, it is assumed that the size of the memory cell array shown in FIG. 2 is same as FIG. 1.

According to the prior art shown in FIG. 2, the initial column addresses of the main even page MAIN_EVEN (1), the spare even page SPARE_EVEN (2), the main odd page MAIN_ODD (3), and the spare odd page SPARE_ODD (4) are '0 0000 00 0000 0000', '0 1000 00 0000 0000', '0 1001 00 0000 0000', and '1 0001 00 0000 0000', respectively. Compared with the structure shown in FIG. 1, the sequence of the spare even page SPARE_EVEN (2) and the main odd page MAIN_ODD (3) are switched with each other.

As described above, according to the structure of the prior art shown in FIG. 1, the pages of the memory cell array are sequentially disposed in the order of the main even page MAIN_EVEN (1), the main odd page MAIN_ODD (2), the spare even page SPARE_EVEN (3), and the spare odd page SPARE_ODD (4), and thus it is possible to perform common column address decoding operation with differentiation of the main even page MAIN_EVEN (1) and the main odd page MAIN_ODD (2) by the upper second bit ('0' or '1') and with differentiation of the spare even page SPARE_EVEN (3) and the spare odd page SPARE_ODD (4) by the upper fifth bit ('0' or '1'). However, according to the structure shown in FIG. 2, the main even page MAIN_EVEN (1) and the main odd page MAIN_ODD (3) are different not only in the upper second bit but also in the upper fifth bit. They are not distinguished by the upper second bit, which means that it is impossible to perform the common column address decoding operation of the prior art shown in FIG. 1. This is because not only the value of the upper second bit but also the value of the upper fifth bit is different. The same concern is present in the spare even page SPARE_EVEN (2) and the spare odd page SPARE_ODD (4). Because of the impossibility of the common column address decoding operation, the column decoding operation has to be performed separately for the even page and for the odd page, which causes needs for independent elements that respectively decode the even page and the odd page, and thus creating the need for double sized column decoding unit. The doubled size of the column decoder also means that the number of CAM (Content Addressable Memory) latches for storing repair information has to be doubled and the number of decoding lines passing through a page buffer has to be increased. This increases the chip size.

Therefore, the prior art shown in FIG. 2 may not be a solution to the half page read operation in the burst mode.

SUMMARY

An embodiment of the present invention is directed to an address mapping circuit that performs an efficient address mapping operation thereby supporting access of memory cell array in a burst mode as well as common column address decoding operation without increasing the size of a semiconductor memory device, the memory cell array of which is divided into multiple regions according to addresses, and an operating method for the address mapping circuit.

In accordance with an embodiment of the present invention, a semiconductor memory device includes a memory cell array configured to include a first main cell array, a first spare cell array, a second main cell array, and a second spare cell array each of which has internal cells that are selected in response to an internal address, and an address mapping unit configured to map external address as the internal address when the external address designates the first main and spare cell arrays, and to operate calculation with a given value and the external address and to map the calculation result value as the internal address when the external address designates the second main and spare cell arrays.

In accordance with another embodiment of the present invention, a method for operating a semiconductor memory device including a first main cell array, a first spare cell array, a second main cell array, and a second spare cell array each of which has internal cells that are selected in response to an internal address, includes comparing a value of an external address with a value of a threshold address, which decides the first main and spare cell arrays from the second main and spare cell arrays to produce a comparison result, mapping the external address as the internal address based on the comparison result, and performing calculation on a given value and the external address based on the comparison result to produce a calculation result number and mapping the calculation result number as the internal address.

In accordance with another embodiment of the present invention, a semiconductor memory device includes a memory cell array configured to include at least two groups of cell arrays, wherein each of the groups is disposed in sequential manner and of substantially same structure to each other, and an address mapping unit configured to selectively convert an external address to an internal address depending on indication of the external address to one of the groups. The external address is arranged in consecutive manner as a whole for the memory cell array, the internal address is arranged in consecutive manner for each of the groups in the memory cell array, and access to the memory cell array is based on the internal address.

Each of the internal addresses for each of main cell arrays of the groups may have same value except for a value of an uppermost bit in the internal address for each of main cell arrays of the groups. Each of the internal addresses for each of spare cell arrays of the groups may have same value except for a value of an uppermost bit in the internal address for each of spare cell arrays of the groups.

The semiconductor memory device may further comprises a counting control unit configured to adjust the counting address into a value of the internal address corresponding to an initial cell of a second group disposed sequentially next to the first group when the counting address becomes a value of the internal address corresponding to the last cell of the first group.

The external address may be inputted from an outside of the memory cell array and the address mapping unit. The external address may be inputted in a burst mode.

The internal address may be used to a common column address decoding operation. The semiconductor memory device may be non-volatile.

In accordance with another embodiment of the present invention, a method for operating a semiconductor memory device including a memory cell array configured to include at least two groups of cell arrays, wherein each of the groups is disposed in sequential manner and of substantially same structure to each other, the method includes deciding on which external address to indicate which one of the groups, and selectively converting the external address to an internal address depending on the result of the decision. The external address is arranged in consecutive manner as a whole for the memory cell array, the internal address is arranged in consecutive manner for each of the groups in the memory cell array, and access to the memory cell array is based on the internal address.

Each of the groups may be disposed in inconsecutive manner in the memory cell array. Each of the internal addresses for each of the groups may have same value except for a value of an uppermost bit in the internal address.

The group may include a main cell array and a spare cell array. Each of the internal addresses for each of main cell arrays of the groups may have same value except for a value of an uppermost bit in the internal address for each of main cell arrays of the groups. Each of the internal addresses for each of spare cell arrays of the groups may have same value except for a value of an uppermost bit in the internal address for each of spare cell arrays of the groups.

The selectively converting may map the external address as the internal address when the result of the decision indicates that the external address indicates a first group that is disposed first in the disposition order. The selectively converting may convert the external address to the internal address, when the result of the decision indicates that the external address indicates one of the groups other than the first group. The selectively converting may convert the external address to the internal address for each of the groups to have same value except for a value of an uppermost bit in the internal address.

The method may further comprise consecutively counting values as a counting address from a value of the internal address indicating a cell of a first group to a value corresponding to a last cell of the first group for access to the memory cell array. The consecutively counting may be performed to a preset number of the groups in the memory cell array.

The method may further comprise adjusting the counting address into a value of the internal address corresponding to an initial cell of a second group disposed sequentially next to the first group when the counting address becomes a value of the internal address corresponding to the last cell of the first group.

The external address may be inputted from an outside of the memory cell array and the address mapping unit. The external address may be inputted in a burst mode.

The internal address may be used to a common column address decoding operation. The semiconductor memory device may be non-volatile.

DETAILED DESCRIPTION

Figure 1:
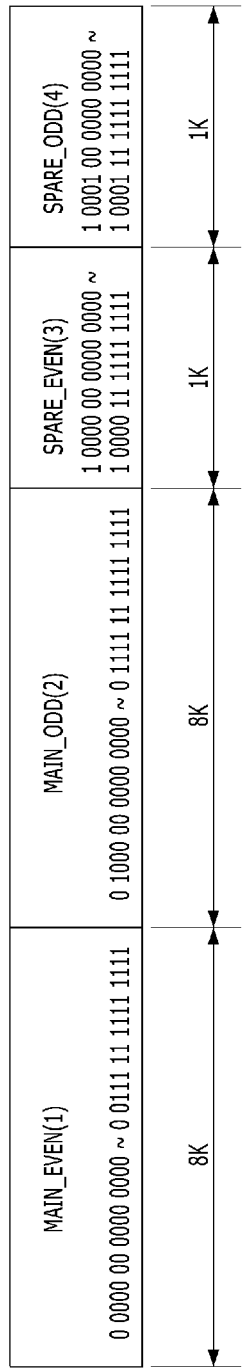
FIG. 1 illustrates a structure of a memory cell array in a non-volatile memory device according to a prior art.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. In addition, a singular form may include a plural form as long as it is not specifically mentioned in a sentence.

According to an embodiment of the present invention, two address schemes for access to memory cell arrays in a semiconductor memory device are provided. First scheme is for an external address used in the outside of the device. The external address corresponding to each of multiple regions of the memory cell arrays is consecutively arranged as a whole, and suitable for the burst mode. Second scheme is for an internal address used for column address decoding of the memory cell arrays. The internal address also corresponding to each of multiple regions of the memory cell arrays is consecutively arranged in part as a unit of read or write and is suitable for the common column address decoding operation without increasing the size of the device. An address mapping circuit, as an embodiment of the present invention, selectively uses the external address itself as the internal address or converts the scheme of the external address to the scheme of the internal address for column address decoding of the memory cell array through an address mapping operation.

Figure 3:
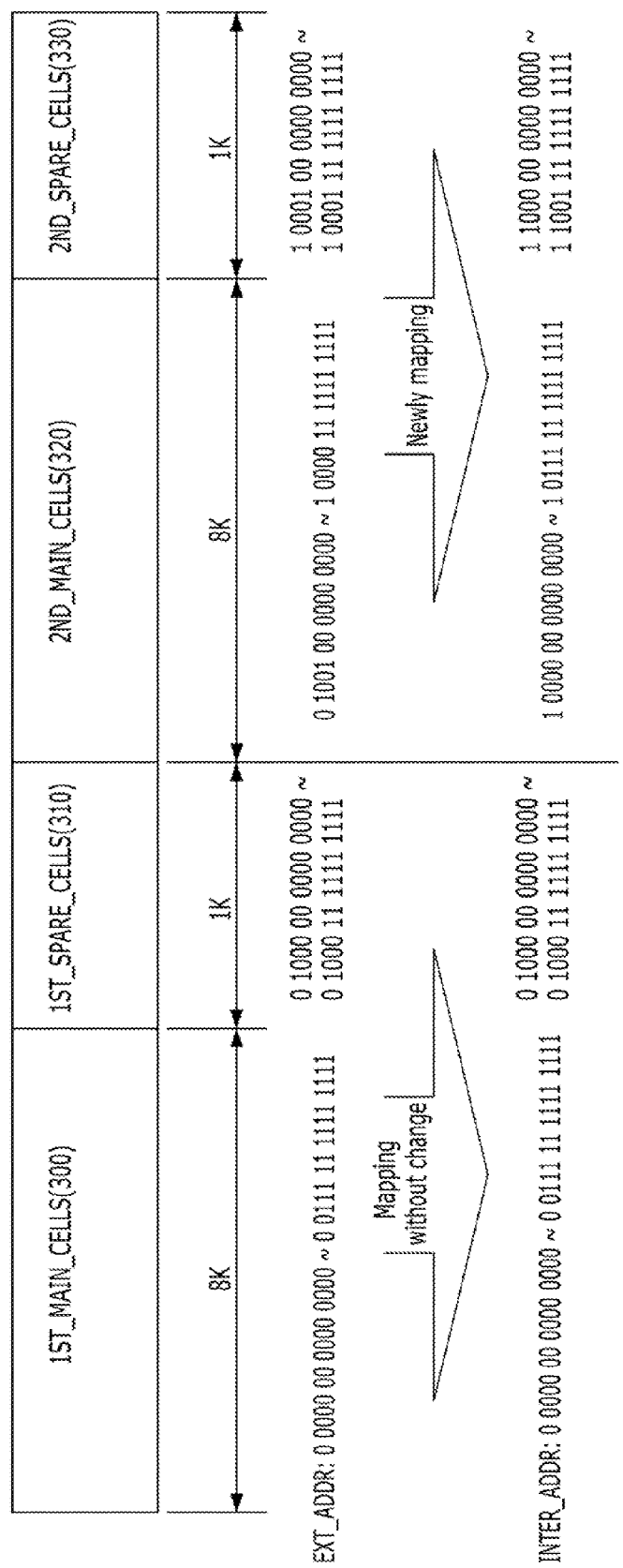
FIG. 3 illustrates a structure of a memory cell array and external addresses and internal addresses for the structure in a semiconductor memory device in accordance with an embodiment of the present invention.

FIG. 3 illustrates a structure of a memory cell array and external addresses and internal addresses for the structure in a semiconductor memory device in accordance with an embodiment of the present invention.

Referring to FIG. 3, the memory cell array of the semiconductor memory device in accordance with the embodiment of the present invention includes a first cell array and a second cell array. Each of the first cell array and the second cell array includes cells of a main memory array and cells of a spare memory array.

The memory cell arrays shown in FIG. 3 are sequentially disposed in the order of a first main cell array 1ST_MAIN_CELLS (300), a first spare cell array 1ST_SPARE_CELLS (310), a second main cell array 2ND_MAIN_CELLS (320), and a second spare cell array 2ND_SPARE_CELLS (330). Even though the cell arrays 1ST_MAIN_CELLS (300), 1ST_SPARE_CELLS (310), 2ND_MAIN_CELLS (320) and 2ND_SPARE_CELLS (330) are directly selected not by the external address EXT_ADDR but by the internal address INTER_ADDR, each of the cell arrays may be recognized with the external address EXT_ADDR externally.

The schemes of external address EXT_ADDR and the internal address INTER_ADDR for designating a cell array among the multiple cell arrays 300, 310, 320 and 330 are different to each other. As described above, the scheme of the external address EXT_ADDR is consecutively arranged as a whole and is suitable for the burst mode, and the scheme of the internal address INTER_ADDR is consecutively arranged in part and is suitable for the common column address decoding operation.

Figure 2:
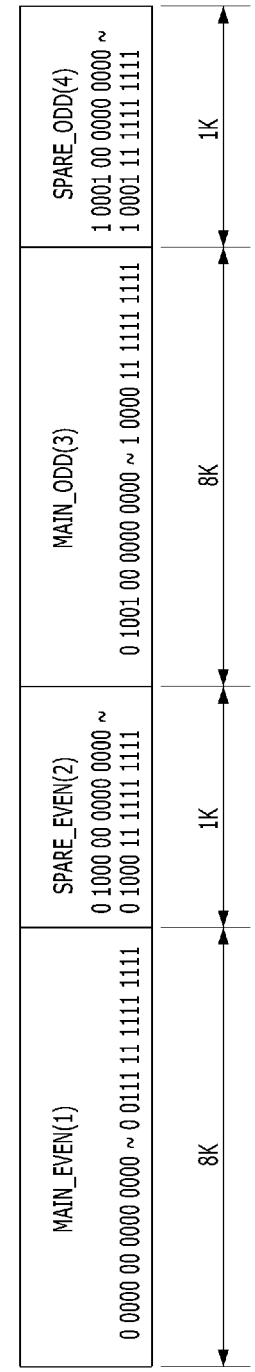
FIG. 2 illustrates a structure of a memory cell array in a non-volatile memory device according to another prior art.

Herein, the structures of the first main cell array 1ST_MAIN_CELLS (300), the first spare cell array 1ST_SPARE_CELLS (310), the second main cell array 2ND_MAIN_CELLS (320) and the second spare cell array 2ND_SPARE_CELLS (330) may correspond to those of the main even pages MAIN_EVEN (1), the spare even page SPARE_EVEN (2), the main odd page MAIN_ODD (3), and the spare odd pages SPARE_ODD (4) shown in FIG. 2, respectively.

The embodiment of the present invention provides a structure and method of setting an internal address to select cells through the common column address decoding operation with the partly consecutive address scheme (the Internal address INTER_ADDR) of the memory cell arrays of multiple regions, and the application of the technology of the embodiment of the present invention is not limited to non-volatile semiconductor memory devices.

FIG. 3 shows examples of the external address EXT_ADDR and the internal address INTER_ADDR for the cell arrays 300, 310, 320 and 330.

FIG. 3 shows as an exemplary embodiment of the present invention that the entire size of the multiple cell arrays 300, 310, 320 and 330 is 18K, and the main cell arrays 300 and 320 occupy 16K of the entire size while the spare cell arrays 310 and 330 occupy 2K.

The first main cell array 1ST_MAIN_CELLS (300) of a size of 8K is disposed foremost among the cell arrays in the disposition order. The external address EXT_ADDR and the internal address INTER_ADDR for the first main cell array 1ST_MAIN_CELLS (300) are the same from '0 0000 00 0000 0000' to '0 0111 11 1111 1111'.

The first spare cell array 1ST_SPARE_CELLS (310) of a size of 1K is disposed right after the first main cell array 1ST_MAIN_CELLS (300). The external address EXT_ADDR and the internal address INTER_ADDR for the first spare cell array 1ST_SPARE_CELLS (310) are same from '0 1000 00 0000 0000' to '0 1000 11 1111 1111'.

The first main cell array 1ST_MAIN_CELLS (300) and the first spare cell array 1ST_SPARE_CELLS (310) respectively have the same external address EXT_ADDR and the same internal address INTER_ADDR.

The second main cell array 2ND_MAIN_CELLS (320) of a size of 8K is disposed right after the first spare cell array 1ST_SPARE_CELLS (310). The external address EXT_ADDR for the second main cell array 2ND_MAIN_CELLS (320) is from '1 1001 00 0000 0000' to '1 0000 11 1111 1111'. As disclosed above, the external address EXT_ADDR is consecutively arranged as a whole, and thus the value of the external address EXT_ADDR for the second main cell array 2ND_MAIN_CELLS (320) is consecutive to the value of the external address EXT_ADDR for the first spare cell array 1ST_SPARE_CELLS (310), which means that the initial and the last values of the external address EXT_ADDR for the second main cell array 2ND_MAIN_CELLS (320) are '0 1001 00 0000 0000' and '1 0000 11 1111 1111' counted from the initial value by as much as 8K, respectively. This shows that the external addresses EXT_ADDRs for the second main cell array 2ND_MAIN_CELLS (320) and the first main cell array 1ST_MAIN_CELLS (300) are suitable for the burst mode. On the other hand, the internal address INTER_ADDR for the second main cell array 2ND_MAIN_CELLS (320) is from '1 0000 00 0000 0000' to '1 0111 11 1111 1111', which means that the internal addresses INTER_ADDRs for the second main cell array 2ND_MAIN_CELLS (320) and the first main cell array 1ST_MAIN_CELLS (300) are arranged to have the same address values except for the one bit, namely the value of the 15$^{th}$ bit from the lowermost bit, which is set as '0' and '1', respectively. This shows that the internal addresses INTER_ADDRs for the second main cell array 2ND_MAIN_CELLS (320) and the first main cell array 1ST_MAIN_CELLS (300) are suitable for the common column address decoding operation. The detailed description for the scheme of the Internal address INTER_ADDR is set forth hereafter.

The second spare cell array 2ND_SPARE_CELLS (330) of a size of 1K is disposed right after the second main cell array 2ND_MAIN_CELLS (320). The external address EXT_ADDR for the second spare cell array 2ND_SPARE_CELLS (330) is from '1 0001 00 0000 0000' to '1 0001 11 1111 1111'. As disclosed above, the external address EXT_ADDR is consecutively arranged as a whole, and thus the value of the external address EXT_ADDR for the second spare cell array 2ND_SPARE_CELLS (330) is consecutive to the value of the external address EXT_ADDR for the second main cell array 2ND_MAIN_CELLS (320), which means that the initial and the last values of the external address EXT_ADDR for the second spare cell array 2ND_SPARE_CELLS (330) are '1 0001 00 0000 0000' and '1 0001 11 1111 1111' counted from the initial value by as much as 1K, respectively. This shows that the external addresses EXT_ADDRs for the second spare cell array 2ND_SPARE_CELLS (330) and the first spare cell array 1ST_SPARE_CELLS (310) are suitable for the burst mode. On the other hand, the internal address INTER_ADDR for the second spare cell array 2ND_SPARE_CELLS (330) is from '1 1000 00 0000 0000' to '1 1001 11 1111 1111', which means that the internal addresses INTER_ADDRs for the second spare cell array 2ND_SPARE_CELLS (330) and the first spare cell array 1ST_SPARE_CELLS (310) are arranged to have the same address values except for the one bit, namely the value of the 11$^{th}$ bit from the lowermost bit, which is set as '0' and '1', respectively. This shows that the internal addresses INTER_ADDRs for the second spare cell array 2ND_SPARE_CELLS (330) and the first spare cell array 1ST_SPARE_CELLS (310) are suitable for the common column address decoding operation. The detailed description for the scheme of the internal address INTER_ADDR is set forth hereafter.

As described above, the semiconductor memory device in accordance with the embodiment of the present invention has two address schemes for access to memory cell arrays, one for the external address EXT_ADDR, and the other one for the internal address INTER_ADDR defined independently from that for the external address EXT_ADDR. Particularly, the sequential disposition order of the memory cell arrays is arranged to be repetitional between the pairs of the main cell array and the spare cell array, and the external address corresponding to each the memory cell arrays is consecutively arranged as a whole for the half page read operation in the burst mode, whereas the internal addresses INTER_ADDRs are arranged consecutively in a pair of the main cell array and the spare cell array. They are arranged to have the same address values except for the one bit between the main cell arrays or the spare cell arrays, thereby making them suitable for the common column address decoding operation.

According to the embodiment of the present invention, the internal addresses INTER_ADDRs are consecutive in the pair of the main cell array and the spare cell array but are not consecutive between the pairs of the main cell array and the spare cell array. As shown in FIG. 3, the value of the last internal address INTER_ADDR of the first pair of the first main cell array 1ST_MAIN_CELLS (300) and the first spare cell array 1ST_SPARE_CELLS (310) is '0 1000 11 1111 1111', and the value of the initial internal address INTER_ADDR of the second pair of the second main cell array 2ND_MAIN_CELLS (320) and the second spare cell array 2ND_SPARE_CELLS (330) is '1 0000 00 0000 0000'. The gap between the value of the last internal address INTER_ADDR of the first pair and the value of the initial internal address INTER_ADDR of the second pair corresponds to a preset value GAP_ADDR_VAL that is described hereafter.

Despite the gap between the value of the last internal address INTER_ADDR of the first pair and the value of the initial internal address INTER_ADDR of the second pair, which is designed for the common column address decoding operation, an operation in the burst mode still may be performed by a circuit for performing an address processing operation in the semiconductor memory device in accordance with the embodiment of the present invention described as follows.

Figure 4:
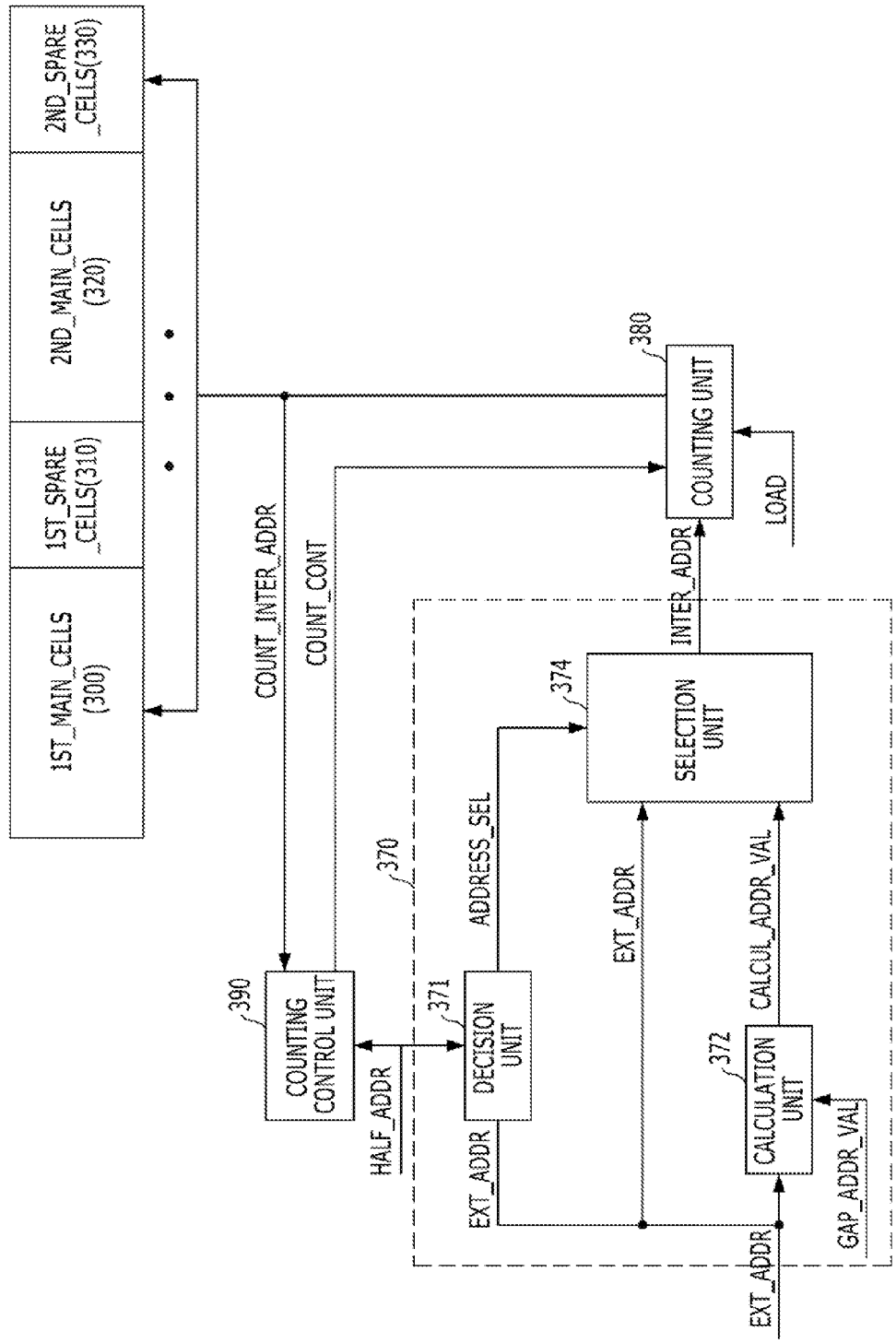
FIG. 4 is a block diagram illustrating a circuit for performing an address processing operation in a semiconductor memory device in accordance with an embodiment of the present invention.

FIG. 4 is a block diagram illustrating a circuit for performing an address processing operation in a semiconductor memory device in accordance with an embodiment of the present invention.

Referring to FIG. 4, the semiconductor memory device in accordance with the embodiment of the present invention includes memory cell arrays 300, 310, 320 and 330 shown in FIG. 3, and an address mapping unit 370. The semiconductor memory device further includes a counting unit 380 and a counting control unit 390. As shown in FIG. 3, the memory cell arrays 300, 310, 320 and 330 include a first main cell array 1ST_MAIN_CELLS (300), a first spare cell array 1ST_SPARE_CELLS (310), a second main cell array 2ND_MAIN_CELLS (320), and a second spare cell array 2ND_SPARE_CELLS (330). The address mapping unit 370 includes a decision unit 371, a calculation unit 372, and a selection unit 374.

As described in FIG. 3, the memory cell arrays 300, 310, 320 and 330 are sequentially disposed in the order of the first main cell array 300, the first spare cell array 310, the second main cell array 320 and the second spare cell array 330. The sequential disposition order of the memory cell arrays is arranged to be repetitional between the pairs of the main cell array and the spare cell array, and the external address EXT_ADDR corresponding to each the memory cell arrays is consecutively arranged as a whole, for the half page read operation in the burst mode, whereas the internal addresses INTER_ADDRs are arranged consecutively in a pair of the main cell array and the spare cell array, but they are arranged to have the same address values except for the one bit between the main cell arrays or the spare cell arrays, thereby making them suitable for the common column address decoding operation.

The address mapping unit 370 selectively uses the external address EXT_ADDR itself as the internal address INTER_ADDR or converts the scheme used for the external address EXT_ADDR to the scheme used for the internal address INTER_ADDR. The address mapping unit 370 maps the external address EXT_ADDR as the internal address INTER_ADDR when the external address EXT_ADDR indicates the first main cell array 300 or the first spare cell array 310. However, when the external address EXT_ADDR indicates the second main cell array 320 or the second spare cell array 330, the address mapping unit 370 performs calculation with a given value GAP_ADDR_VAL and the external address EXT_ADDR, and maps the calculation result as the internal address INTER_ADDR. In short, the address mapping unit 370 decides whether to use one of the external address EXT_ADDR itself and the result calculation with the given value GAP_ADDR_VAL and the external address EXT_ADDR as the internal address INTER_ADDR according to the value of the external address EXT_ADDR.

Figure 6:
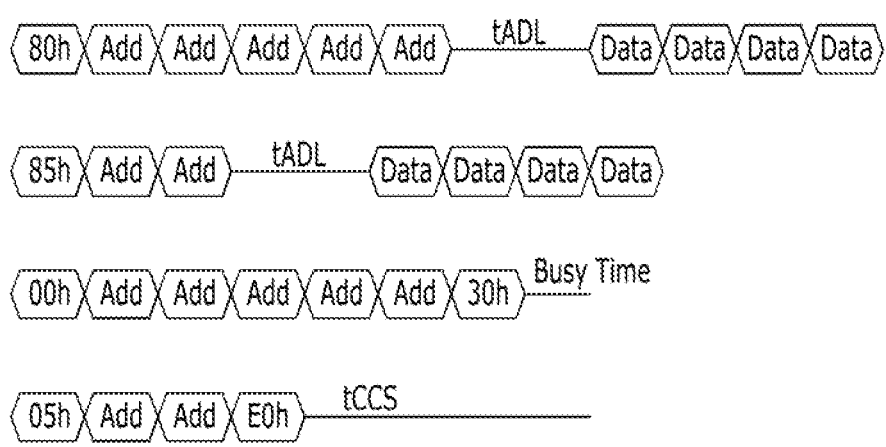
FIG. 6 is a timing diagram as an example for an address processing operation performed in a semiconductor memory device.

Since the address mapping unit 370 may perform its operation during preset time margins, the overall operation of the semiconductor memory device may be performed without any delay due to the operation of the address mapping unit 370. To be specific, FIG. 6 shows a standardized timing diagram as an example for the address processing operation performed in a semiconductor memory device, e.g. a NAND flash memory device. A predetermined time tADL, which may be defined as time between address cycle to data loading for program operations, is given until an input/output data is inputted after an address ADD is inputted, and also a predetermined time tCCS, which may be defined as change column setup time for commands modifying column address, is given after the input of the address ADD is completed even in the operation of the typical semiconductor memory device. The predetermined times tADL and tCCS are defined in Open NAND Flash Interface (ONFI) Specification presented by an industry workgroup ONFI. As described above, since the address mapping unit 370 operates in the standardized preset time margins tADL and tCCS in the typical semiconductor memory device, the operation of the address mapping unit 370 may not delay the operation of the semiconductor memory device.

The decision unit 371 decides whether the external address EXT_ADDR designates any one cell array between the first main cell array 300 and the first spare cell array 310 or between the second main cell array 320 and the second spare cell array 330. When the external address EXT_ADDR has a value for selecting the cells of the first main cell array 300 or the cells of the first spare cell array 310, the decision unit 371 enables a decision signal ADDRESS_SEL. When the external address EXT_ADDR has a value for selecting the cells of the second main cell array 320 or the cells of the second spare cell array 330, the decision unit 371 disables the decision signal ADDRESS_SEL.

The decision unit 371 decides whether to enable the decision signal ADDRESS_SEL with the external address EXT_ADDR and a threshold address HALF_ADDR that distinguishes between the pairs of the main cell array and the spare cell array, or distinguishes a pair of the first main cell array 300 and the first spare cell array 310 from a pair of the second main cell array 320 and the cells of the second spare cell array 330. Herein, since the external address EXT_ADDR is consecutive, for example, the value of the threshold address HALF_ADDR may correspond to the size of the pair of the main cell array and the spare cell array, namely the size of the pair of the first main cell array 300 and the first spare cell array 310, the size of the pair of the second main cell array 320 and the second spare cell array 330, or half the size of all the main cell arrays and the spare cell arrays.

Referring back to FIG. 3, the operation of the decision unit 371 is described with an example. When the value of the external address EXT_ADDR falls between '0 0000 00 0000 0000' and '0 0111 11 1111 1111' and thus selects the cells of the first main cell array 300, or when the value of the external address EXT_ADDR falls between '0 1000 00 0000

0000' and '0 1000 11 1111 1111' and thus has a value for selecting the cells of the first spare cell array 310, the decision unit 371 enables the decision signal ADDRESS_SEL. However, when the value of the external address EXT_ADDR falls between '0 1001 00 0000 0000' and '1 0000 11 1111 1111' and thus selects the cells of the second main cell array 320, or when the value of the external address EXT_ADDR falls between '1 0001 00 0000 0000' and '1 0001 11 1111 1111' and thus selects the cells of the second spare cell array 330, the decision unit 371 disables the decision signal ADDRESS_SEL.

Therefore, the value of the threshold address HALF_ADDR may be one of '0 1000 11 1111 1111' and '0 1001 00 0000 0000' that are the last value of the external address EXT_ADDR for the first spare cell array 310 and the initial value of the external address EXT_ADDR for the second main cell array 320, respectively. For example, if the value of the external address EXT_ADDR is equal to or lesser than '0 1000 11 1111 1111', the decision signal ADDRESS_SEL is enabled. Also, if the value of the external address EXT_ADDR is equal to or greater than '0 1001 00 0000 0000', the decision signal ADDRESS_SEL is disabled. Similarly, if the value of the external address EXT_ADDR is lesser than '0 1001 00 0000 0000', the decision signal ADDRESS_SEL is enabled. Also, if the value of the external address EXT_ADDR is greater than '0 1000 11 1111 1111', the decision signal ADDRESS_SEL is disabled.

In other words, the value of the threshold address HALF_ADDR may be a value corresponding to the sum, which is 9K, of the size of the first main cell array 300, which is 8K, and the size of the first spare cell array 310, which is 1K. In short, the value of the threshold address HALF_ADDR may be '0 1000 11 1111 1111' disposed in the 9K$^{th}$ position from '0 0000 00 0000 0000'. Also, the value of the threshold address HALF_ADDR may be a value corresponding to the sum, which is 9K, of the size of the second main cell array 320, which is 8K, and the size of the second spare cell array 330, which is 1K. In short, the value of the threshold address HALF_ADDR may be '0 1001 00 0000 0000' disposed in the 9K$^{th}$ position from '0 0001 11 1111 1111' in the reverse order. Also, the value of the threshold address HALF_ADDR may be a value, which is 9K, obtained by dividing the sum, which is 18K, of the size of the first main cell array 300, which is 8K, the size of the first spare cell array 310, which is 1K, the size of the second main cell array 320, which is 8K, and the size of the second spare cell array 330, which is 1K, by 2. In short, the value of the threshold address HALF_ADDR may be '0 1000 11 1111 1111' or '0 1001 00 0000 0000'.

The calculation unit 372 performs an ADD operation on the given value GAP_ADDR_VAL and the external address EXT_ADDR to generate a calculated address CALCUL_ADDR_VAL.

The selection unit 374 selects any one between the external address EXT_ADDR and the calculated address CALCUL_ADDR_VAL outputted from the calculation unit 372 in response to the decision signal ADDRESS_SEL of the decision unit 371 and outputs the selected one as the internal address INTER_ADDR. When the decision signal ADDRESS_SEL is enabled, the selection unit 374 selects the external address EXT_ADDR as the internal address INTER_ADDR. When the decision signal ADDRESS_SEL is disabled, the selection unit 374 selects the calculated address CALCUL_ADDR_VAL as the internal address INTER_ADDR.

As described above, the memory cell arrays shown in FIGS. 3 and 4 are sequentially disposed in the order of a first main cell array 1ST_MAIN_CELLS (300), a first spare cell array 1ST_SPARE_CELLS (310), a second main cell array 2ND_MAIN_CELLS (320), and a second spare cell array 2ND_SPARE_CELLS (330) and the external address EXT_ADDR for the memory cell arrays is consecutively arranged as a whole.

On the other hand, the internal address INTER_ADDR for the memory cell arrays is arranged sequentially but not consecutively as a whole. The internal addresses INTER_ADDRs are arranged consecutively in a pair of the main cell array and the spare cell array, but arranged inconsecutively with the preset value GAP_ADDR_VAL to have the same address values except for the one bit between the main cell arrays or the spare cell arrays. The preset value GAP_ADDR_VAL indicates a gap between the value of the last internal address INTER_ADDR of the first pair and the value of the initial internal address INTER_ADDR of the second pair. The first main cell array 300 and the second main cell array 320 are made to have the same address value except for one bit by spacing the gap between the first spare cell array 310 and the second main cell array 320 as much as the given value GAP_ADDR_VAL in the embodiment of the present invention described before. For the scheme of internal address INTER_ADDR, the given value GAP_ADDR_VAL may have a size to change the uppermost bit of the internal address INTER_ADDR. For example, the given value GAP_ADDR_VAL may be a value corresponding to the size of the first spare cell array 310, exclusive of the size of the first main cell array 300. Also, the given value GAP_ADDR_VAL may be a number corresponding to the size of the second spare cell array 330, exclusive of the size of the second main cell array 320. Similarly, the given value GAP_ADDR_VAL may be a number corresponding to half the size of the first main cell array 300 and the second main cell array 320, exclusive of the size of the first spare cell array 310 and the second spare cell array 330.

Referring back to FIG. 3, the operation of the calculation unit 372 is described by taking an example. The first main cell array 300 and the second main cell array 320 have a size of 8K, respectively, and the first spare cell array 310 and the second spare cell array 330 have a size of 1K, respectively. The given value GAP_ADDR_VAL may be of 7K, which corresponds to the size of the main cell array exclusive of the size of the spare cell array, or half the size of the two main cell arrays exclusive of the two spare cell arrays. Therefore, the given value GAP_ADDR_VAL may be '0 0111 00 0000 0000' that corresponds to the value of 7K.

When the value of the external address EXT_ADDR falls between '0 1001 00 0000 0000' and '1 0000 11 1111 1111' and selects the cells of the second main cell array 320, the output value of the calculation unit 372, which is a result of adding the given value GAP_ADDR_VAL '0 0111 00 0000 0000' to the external address EXT_ADDR from '1 0000 00 0000 0000' to '1 0111 11 1111 1111'. Compared with the external address EXT_ADDR from '0 0000 00 0000 0000' to '0 0111 11 1111 1111', the output value of the calculation unit 372 is same except for their uppermost bit, which is '1' and '0'. Similarly, when the value of the external address EXT_ADDR falls between '1 0001 00 0000 0000' and '1 0001 11 1111 1111' and thus selects the cells of the second spare cell array 330, the output value of the calculation unit 372, which is a result of adding the given value GAP_ADDR_VAL '0 0111 00 0000 0000' to the external address EXT_ADDR from '1 1000 00 0000 0000' to '1 1000 11 1111 1111'. Compared with the external address EXT_ADDR from '0 1000 00 0000 0000' to '0 1000 11 1111 1111', the output value of the calculation unit 372 is same except for their uppermost bit, which is '1' and '0'.

To sum up, the address mapping unit 370 selects the external address EXT_ADDR itself as the internal address INTER_ADDR, or converts the scheme of the external address EXT_ADDR to the scheme of the internal address INTER_ADDR, in response to the external address EXT_ADDR indicating first pair of the main cell array and the spare cell array or second pair of the main cell array and the spare cell array. The internal address INTER_ADDR outputted from the address mapping unit 370 is set to select the cells through the common column address decoding operation regardless of whether the external address EXT_ADDR has a value for selecting the first main cell array 300 and the first spare cell array 310 or a value for selecting the second main cell array 320 and the second spare cell array 330. In short, the value of the internal address INTER_ADDR for selecting the cells of the first main cell array 300 and the value of the internal address INTER_ADDR for selecting the cells of the second main cell array 320 are set to have same bits except the uppermost one bit for the common column address decoding operation. Similarly, the value of the internal address INTER_ADDR for selecting the cells of the first spare cell array 310 and the value of the internal address INTER_ADDR for selecting the cells of the second spare cell array 330 are set to have same bits except the uppermost one bit for the common column address decoding operation.

The counting unit 380 sequentially counts the internal addresses INTER_ADDR outputted from the address mapping unit 370 and outputs a counting address COUNT_INTER_ADDR. Since the counting address COUNT_INTER_ADDR is obtained by sequentially changing the value of the internal address INTER_ADDR outputted from the address mapping unit 370, it is possible to sequentially select the cells of the memory cell arrays 300, 310, 320 and 330 according to the value of the counting address COUNT_INTER_ADDR. The counting unit 380 is for operation in the burst mode of the semiconductor memory device.

Therefore, the counting unit 380 receives the internal address INTER_ADDR from the selection unit 374, sequentially counts a value starting from the received internal address INTER_ADDR, and outputs the counting address COUNT_INTER_ADDR so that the cells are sequentially selected from the cell array corresponding to an inputted internal address INTER_ADDR among the multiple cell arrays 300, 310, 320 and 330 to the last cell of the second spare cell array 330, when a load signal LOAD toggles in response to the decision signal ADDRESS_SEL.

The counting control unit 390 adjusts the counting address COUNT_INTER_ADDR into a value corresponding to the initial cell of the second main cell array 320 in response to the counting address COUNT_INTER_ADDR, which is outputted from the counting unit 380, becoming a value corresponding to the last cell of the first spare cell array 310. As described before in the structure of the address mapping unit 370, the value of the internal address INTER_ADDR corresponding to the last cell of the first spare cell array 310 and the value of the internal address INTER_ADDR corresponding to the initial cell of the second main cell array 320 are spaced apart as much as the given value GAP_ADDR_VAL. Therefore, when the counting unit 380 performs a counting operation in consecutive manner after it counts the value of the internal address INTER_ADDR corresponding to the last cell of the first spare cell array 310 as the counting address COUNT_INTER_ADDR, it is not possible to reach the internal address INTER_ADDR corresponding to the initial cell of the second main cell array 320. For this reason, the counting control unit 390 decides whether or not the value of the counting address COUNT_INTER_ADDR outputted from the counting unit 380 corresponds to the last cell of the first spare cell array 310, and when the value of the counting address COUNT_INTER_ADDR corresponds to the last cell of the first spare cell array 310, the counting control unit 390 controls the value of the counting address COUNT_INTER_ADDR to become a value corresponding to the initial value of the second main cell array 320.

Referring back to FIG. 3, the operation of the counting control unit 390 is described with an example. The counting control unit 390 detects whether or not the counting address COUNT_INTER_ADDR outputted from the counting unit 380 is '0 1000 11 1111 1111', and when the counting address COUNT_INTER_ADDR outputted from the counting unit 380 becomes '0 1000 11 1111 1111', the counting control unit 390 jumps the value of the counting address COUNT_INTER_ADDR to '1 0000 00 0000 0000' as address value right next to the value of '0 1000 11 1111 1111'. For example, the jumping value may correspond to the given value GAP_ADDR_VAL '0 0111 00 0000 0000' indicating the gap between the value of the last internal address INTER_ADDR of the first pair and the value of the Initial internal address INTER_ADDR of the second pair.

As further embodiment of the present invention, the counting control unit 390 may control the operation of the counting unit 380 in various ways. For example, the counting control unit 390 may control the counting unit 380 to increase the value of the counting address COUNT_INTER_ADDR as much as the given value GAP_ADDR_VAL in response to the enabling of a counting control signal COUNT_CONT outputted from the counting control unit 390. Also, the counting control unit 390 may add the given value GAP_ADDR_VAL to the value of the counting address COUNT_INTER_ADDR and transfer the addition result to the counting unit 380 as the counting control signal COUNT_CONT. The counting unit 380 then performs a counting operation again from the value of the counting control signal COUNT_CONT and outputs the counting address COUNT_INTER_ADDR.

To be specific, the counting unit 380 and the counting control unit 390 perform the following operation to support a half read operation where the cells of the memory cell array 300, 310, 320 and 330 are divided into halves and then read the cells in a burst mode.

When the external address EXT_ADDR as it is outputted as the internal address INTER_ADDR based on the operation result of the address mapping unit 370, a counting operation is performed to sequentially select cells from the cells of any one cell array corresponding to the internal address INTER_ADDR between the first main cell array 300 and the first spare cell array 310 to the last cell of the second spare cell array 330. Herein, the counting control unit 390 operates at a moment when the value of the counting address COUNT_INTER_ADDR becomes the value of the internal address INTER_ADDR corresponding to the last cell of the first spare cell array 310 so that the value of the counting address COUNT_INTER_ADDR becomes the value of the internal address INTER_ADDR corresponding to the initial cell of the second main cell array 320. In this way, the counting operation is performed as if there is no gap between the first spare cell array 310 and the second main cell array 320.

Also, when the given value GAP_ADDR_VAL set in the external address EXT_ADDR is calculated according to the operation result of the address mapping unit 370 and the calculation result is outputted as the internal address INTER_ADDR, a counting operation is performed to sequentially select cells from the cells of any one cell array corresponding to the internal address INTER_ADDR between the second main cell array 320 and the second spare cell array 330 to the last cell of the second spare cell array 330. Herein, since the value of the counting address COUNT_INTER_ADDR does not reach the value of the internal address INTER_ADDR corresponding to the last cell of the first spare cell array 310, the counting control unit 390 does not perform any operation.

As well as the half read operation, the counting unit 380 may perform a full read operation of the memory cell array 300, 310, 320 and 330 with the external address EXT_ADDR. For example, the counting unit 380 may operate in such a manner that it counts the external address EXT_ADDR. Since the external address EXT_ADDR has consecutive values without any disconnection in the middle in this case, the operation of the counting control unit 390 is not required. Therefore, the counting control unit 390 may be disabled or omitted from the structure of the semiconductor memory device. Also, the external address EXT_ADDR may be inputted in a burst mode. In this case, the operation of the counting unit 380 is not necessary. Therefore, the counting unit 380 may be disabled or omitted from the structure of the semiconductor memory device.

Figure 5:
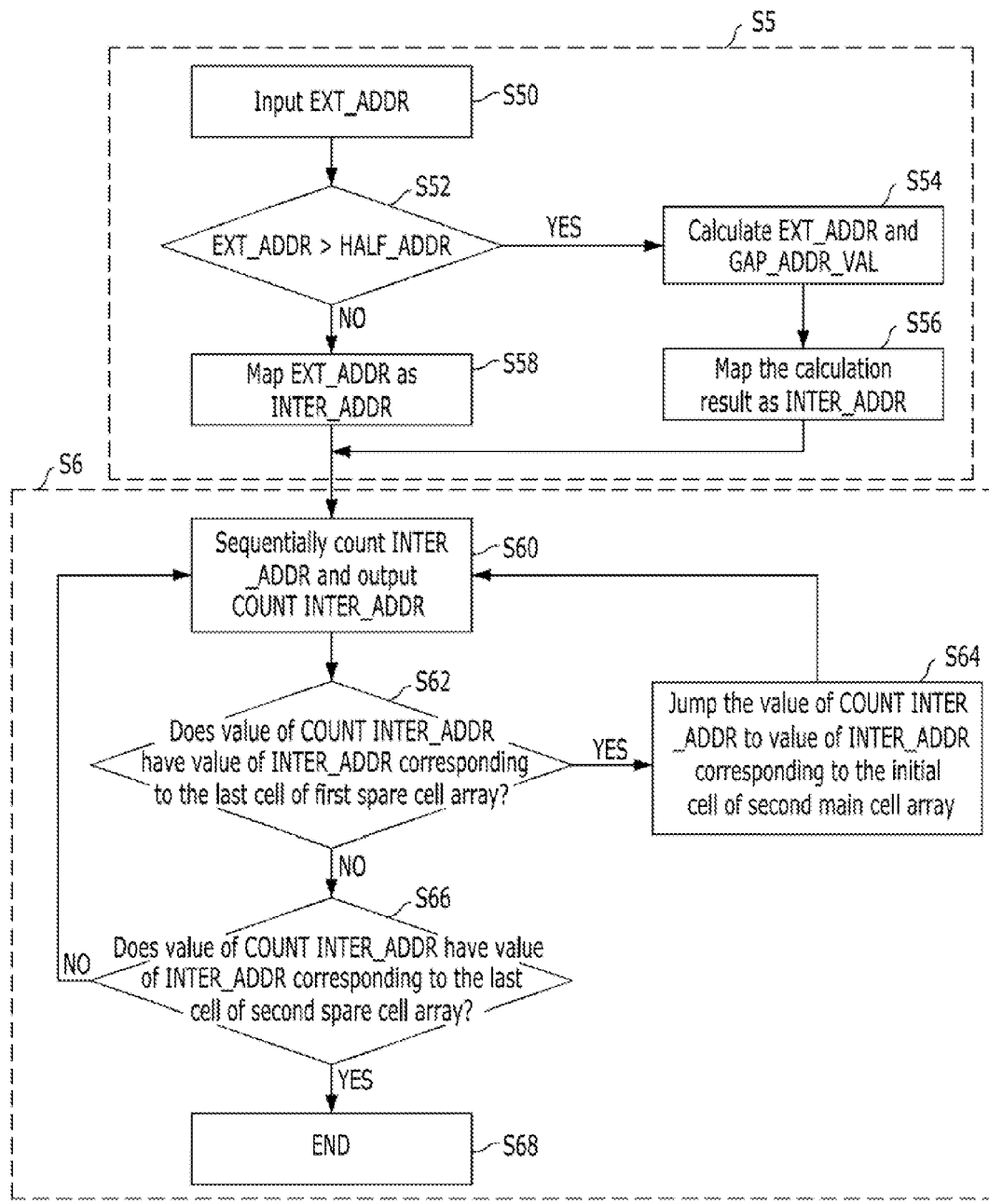
FIG. 5 is a flowchart describing an address processing operation of a semiconductor memory device in accordance with an embodiment of the present invention.

FIG. 5 is a flowchart describing an address processing operation of a semiconductor memory device in accordance with an embodiment of the present invention.

Referring to FIG. 5, the semiconductor memory device in accordance with the embodiment of the present invention includes an operation S5 of mapping the external address EXT_ADDR to the internal address INTER_ADDR, and an operation S6 of counting the mapped internal address INTER_ADDR for the burst mode.

Hereafter, the operation S5 of mapping the external address EXT_ADDR to the internal address INTER_ADDR is described.

As described in FIG. 3, the semiconductor memory device in accordance with the embodiment of the present invention includes the first main cell array 300, the first spare cell array 310, the second main cell array 320, and the second spare cell array 330, which are sequentially disposed in order.

In step S50, the operation begins as the external address EXT_ADDR is inputted from the outside of the semiconductor memory device.

In step S52, the value of the inputted external address EXT_ADDR is compared with the value of the threshold address HALF_ADDR that distinguishes between the pairs of the main cell array and the spare cell array, or distinguishes a pair of the first main cell array 300 and the first spare cell array 310 from a pair of the second main cell array 320 and the cells of the second spare cell array 330. In short, the value of the external address EXT_ADDR is compared with the value of the threshold address HALF_ADDR in the step S52 to decide whether the value of the external address EXT_ADDR is greater or lesser than or equal to the value of the threshold address HALF_ADDR.

If the value of the external address EXT_ADDR designates the second main cell array 320 and the second spare cell array 330, it means that the value of the external address EXT_ADDR is greater than the value of the threshold address HALF_ADDR ("YES" in the step S52).

When the value of the external address EXT_ADDR is greater than the value of the threshold address HALF_ADDR ("YES" in the step S52), ADD operation to the given value GAP_ADDR_VAL and the external address EXT_ADDR is performed in step S54 to produce a calculation result value CALCUL_ADDR_VAL, and the calculation result value CALCUL_ADDR_VAL is mapped as the internal address INTER_ADDR in step S56.

If the value of the external address EXT_ADDR designates the first main cell array 300 and the first spare cell array 310, it means that the value of the external address EXT_ADDR is lesser than or equal to the value of the threshold address HALF_ADDR ("No" in the step S52).

When the value of the external address EXT_ADDR is lesser than the value of the threshold address HALF_ADDR ("No" in the step S52), the value of the external address EXT_ADDR itself is mapped as the internal address INTER_ADDR in step S58.

Herein, since the value of the threshold address HALF_ADDR becomes the criterion for dividing the first main cell array 300 and the first spare cell array 310 from the second main cell array 320 and the second spare cell array 330, it may be a value corresponding to the sum of the number of the cells in the first main cell array 300 and the number of the cells in the first spare cell array 310. Also, the threshold address HALF_ADDR may be a number corresponding to the sum of the number of the cells in the second main cell array 320 and the number of the cells in the second spare cell array 330. Also, the threshold address HALF_ADDR may be a number corresponding to a number obtained by summing up the number of the cells in the first main cell array 300, the number of the cells in the first spare cell array 310, the number of the cells in the second main cell array 320 and the number of the cells in the second spare cell array 330 and dividing the sum number by 2. Herein, since the number of the threshold address HALF_ADDR is described before with reference to FIGS. 3 and 4, further description on it is not provided herein.

When the operation of mapping the external address EXT_ADDR itself as the internal address INTER_ADDR in the step S58 and the ADD operation to the given value GAP_ADDR_VAL and the external address EXT_ADDR in the step S54 to produce a calculation result CALCUL_ADDR_VAL and then mapping the calculation result CALCUL_ADDR_VAL as the internal address INTER_ADDR in the step S56 are all performed with respect to the external address EXT_ADDR, the mapping between the external address EXT_ADDR and the internal address INTER_ADDR for the multiple cell arrays 300, 310, 320 and 330 has the following difference.

First, the external address EXT_ADDR has a consecutive value and sequentially corresponds to the first main cell array 300, the first spare cell array 310, the second main cell array 320, and the second spare cell array 330.

The internal addresses INTER_ADDR, however, sequentially correspond to the first main cell array 300 and the first spare cell array 310 while having consecutive values, and also sequentially correspond to the second main cell array 320 and the second spare cell array 330 while having consecutive values. However, the internal addresses INTER_ADDR sequentially correspond to the first spare cell array 310 and the second main cell array 320 with a difference as much as the given value GAP_ADDR_VAL.

Also, as described in FIG. 3, the internal address INTER_ADDR is set in such a manner that the decoding process is performed in common between the repetitional cell arrays, which are the first main cell array 300 and the first spare cell array 310 or the second main cell array 320 and the second spare cell array 330. Therefore, the given value GAP_ADDR_VAL may be a number corresponding to a number obtained by subtracting the number of the cells in the first spare cell array 310 from the number of the cells in the first main cell array 300. Also, the given value GAP_ADDR_VAL may be a number corresponding to a number obtained by subtracting the number of the cells in the second spare cell array 330 from the number of the cells in the second main cell array 320. Also, the given value GAP_ADDR_VAL may be a number corresponding to a number obtained by subtracting the sum of the number of the cells in the first spare cell array 310 and the number of the cells in the second spare cell array 330 from the sum of the number of the cells in the first main cell array 300 and the number of the cells in the second main cell array 320 to produce a subtraction result number and dividing the subtraction result number by 2. Since the given value GAP_ADDR_VAL is described before with reference to FIGS. 3 and 4, further description on it is not provided herein.

Hereafter, the operation S6 of counting the mapped internal address INTER_ADDR for the burst mode is described.

First, in step S60, counting a value starting from the value of the internal address INTER_ADDR, which is obtained from the step of S58 or S56, is performed and the counting result is outputted as a counting address COUNT_INTER_ADDR.

In step S62, it is decided whether the value of the counting address COUNT_INTER_ADDR has the same value as the value corresponding to the last cell of the first spare cell array 310.

If the mapped internal address INTER_ADDR is obtained from the step of S58, the counting starts from the value of the internal address INTER_ADDR corresponding to the cells of any one cell array between the first main cell array 300 and the first spare cell array 310. In this case, the value of the counting address COUNT_INTER_ADDR may be the same as the value corresponding to the last cell of the first spare cell array 310 ("YES" in the step S62) during the counting operation. However, if the mapped internal address INTER_ADDR is obtained from the step of S56, the counting starts from the value of the internal address INTER_ADDR corresponding to the cells of any one cell array between the second main cell array 320 and the second spare cell array 330. In this case, the value of the counting address COUNT_INTER_ADDR is not the same as the value corresponding to the last cell of the first spare cell array 310 during the counting operation ("NO" in the step S62).

When the value of the counting address COUNT_INTER_ADDR becomes the same as the value corresponding to the last cell of the first spare cell array 310 during the counting operation ("YES" in the step S62), the counting address COUNT_INTER_ADDR is adjusted into a value corresponding to the initial cell of the second main cell array 320 in step S64, and then the counting address COUNT_INTER_ADDR continues to be counted in step S60. In other words, since the value of the internal address INTER_ADDR corresponding to the last cell of the first spare cell array 310 and the value of the internal address INTER_ADDR corresponding to the initial cell of the second main cell array 320 have a difference, which could be as much as the given value GAP_ADDR_VAL, from each other, the initial cell of the second main cell array 320 cannot be consecutively selected subsequent to the last cell of the first spare cell array 310 because the counting address COUNT_INTER_ADDR is counted continuously. Therefore, when the value of the counting address COUNT_INTER_ADDR becomes the same as the value corresponding to the last cell of the first spare cell array 310 ("YES" in the step S62) during the counting operation, it needs to jump the value of the counting address COUNT_INTER_ADDR to a value corresponding to the initial cell of the second main cell array 320 (S64). After the value of the counting address COUNT_INTER_ADDR is adjusted into the value corresponding to the initial cell of the second main cell array 320 in the step S64, the counting operation is performed continuously to perform the burst mode operation.

When the case where the value of the counting address COUNT_INTER_ADDR becomes the same as the value corresponding to the last cell of the first spare cell array 310 does not occur during the counting operation ("NO" in the step S62), the counting operation has to be performed continuously to perform the burst mode operation.

When the case where the value of the counting address COUNT_INTER_ADDR becomes the same as the value corresponding to the last cell of the first spare cell array 310 does not occur during the counting operation ("NO" in the step S62), it is decided again whether the value of the counting address COUNT_INTER_ADDR is the same as the value corresponding to the last cell of the second spare cell array 330 in step S66.

The fact that the value of the counting address COUNT_INTER_ADDR is the same as the value corresponding to the last cell of the second spare cell array 330 ("YES" in the step S66) means it does not have to perform the counting operation any more. Thus, the counting operation ends in step S68.

However, since the fact that the value of the counting address COUNT_INTER_ADDR is different from the value corresponding to the last cell of the second spare cell array 330 ("NO" in the step S66) means that the counting operation needs to be performed continuously, the counting operation is performed continuously in the step S60.

According to the technology of the embodiments of the present invention described above, it is decided which region is selected by an external address that is applied from the outside of a semiconductor memory device in the semiconductor memory device operating by dividing memory cell arrays into multiple regions, and then a value of the external address is calculated based on the decision result and mapped to an internal address. Herein, the internal addresses respectively corresponding to the regions are decided in advance to select the cells of the regions through a decoding process performed in common to at least two regions. In this way, the internal cells belonging to each region may be sequentially selected through a burst operation while minimizing the occupied area.

In other words, in the semiconductor memory device operating by dividing the memory cell arrays into multiple regions, the external address is mapped to the internal address in such a manner that the cells of each region are sequentially selected through a common decoding process that is performed on at least two regions, regardless of how the value of the external address corresponding to each region is decided. This may support a high-speed data input/output operation through a burst operation while minimizing the occupied area.

While the present invention has been described with respect to the specific embodiments, it will be apparent to those skilled in the art that various changes and modifications may be made without departing from the spirit and scope of the invention as defined in the following claims.

For example, even though the detailed embodiment of the present invention described above may be applied to a non-volatile memory device such as a NAND Flash memory device, those skilled in the art may understand that the spirit and scope of the present invention is not limited to nonvolatile memory devices but covers all kinds of semiconductor memory devices having a cell array that is divided into multiple regions and operating according to an address as an address processing operation for performing a bust operation.

What is claimed is:

1. A semiconductor memory device comprising:
a memory cell array configured to include a first main cell array, a first spare cell array, a second main cell array, and a second spare cell array each of which has internal cells that are selected in response to internal addresses, and
an address mapping unit configured to map an external address as a first main internal address when the external address designates the first main cell array,
map the external address as a first spare internal address when the external address designates the first spare cell array,
map a calculation result as a second main internal address when the external address designates the second main cell array, and
map the calculation result as a second spare internal address when the external address designates the second spare cell array; and
wherein the calculation result is obtained by adding a given value to the external address, and
wherein the given value is a value corresponding to one of a number obtained by subtracting a total number of the cells of the first spare cell array from a total number of cells of the first main cell array, a number obtained by subtracting a total number of the cells of the second spare cell array from a total number of cells of the second main cell array, or a number obtained by subtracting a sum of a total number of cells of the first spare cell array and a total number of cells of the second spare cell array from a sum of a total number of cells of the first main cell array and a total number of cells of the second main cell array and dividing the number obtained by 2; and
wherein the first main internal address and the second main internal address have the same bits except for an uppermost one bit,
the first spare internal address and the second spare internal address have the same bits except for an uppermost one bit, and
the first main internal address and the first spare internal address have the same bits except for one bit; and
wherein the internal addresses comprises the first main internal address, the first spare internal address, the second main internal address, and the second spare internal address; and
wherein the external address is inputted in burst mode, and
wherein the external address inputted in the memory cell array is consecutive across the first main cell array, the first spare cell array, the second main cell array and a second spare cell array, and
wherein the first main internal address and the first spare internal address is consecutive across the first main cell array and the first spare cell array, the second main internal address and second spare internal address is consecutive across the second main cell array and the second spare cell array, and the first spare internal address and the second main internal address is non-consecutive across the first spare cell array and the second main cell array.

2. The semiconductor memory device of claim 1, wherein the address mapping unit comprises:
a decision unit configured to decide whether the external address designates i) the first main or the first spare cell arrays, or ii) the second main or the second spare cell arrays;
a calculation unit configured to perform the calculation result; and
a selection unit configured to select in response to a decision result of the decision unit, one of i) the external address as the first main internal address or the external address as the first spare internal address or ii) the calculation result as the second main internal address or the calculation result as the second spare internal address.

3. The semiconductor memory device of claim 2, wherein the decision unit decides whether the external address is greater than, lesser than or equal to a value of a threshold address, so that the cell arrays are divided into the first main cell array, the first spare cell arrays, the second main cell array and the second spare cell arrays.

4. The semiconductor memory device of claim 3, wherein the value of the threshold address is selected from a group comprising:
a value corresponding to a number obtained by summing the total number of the cells of the first main cell array and the total number of the cells of the first spare cell array,
a value corresponding to a number obtained by summing the total number of the cells of the second main cell array and the total number of the cells of the second spare cell array, and
a value corresponding to a number obtained by summing the total number of the cells of the first main cell array, the total number of the cells of the first spare cell array, the total number of the cells of the second main cell array, and the total number of the cells of the second spare cell array and dividing the number obtained by 2.

5. The semiconductor memory device of claim 1, further comprising:
a counting unit configured to sequentially count a counting address from a value of the internal addresses to a value corresponding to a last cell of the second spare cell array for access to the memory cell array; and
a counting control unit configured to adjust the counting address to a value of the internal addresses corresponding to an initial cell of the second main cell array in response to the counting address matching a value of the internal addresses corresponding to a last cell of the first spare cell array.

6. A method for operating a semiconductor memory device including a first main cell array, a first spare cell array, a second main cell array, and a second spare cell array each of which has internal cells that are selected in response to internal addresses, the method comprising:
mapping the external address as a first main internal address when the external address indicates the first main cell array,
mapping the external address as a first spare internal address when the external address indicates the first spare cell array, and
adding a given value to the external address to produce a calculation result number and mapping the calculation result number as a second main internal address when the external address indicates the second main cell array, and mapping the calculation result number to a second spare internal address when the external address indicates the second spare cell array; and, wherein the given value is a value corresponding to one of a number obtained by subtracting a total number of the cells of the first spare cell array from a total number of cells of the first main cell array, a number obtained by subtracting a total number of the cells of the second spare cell array from a total number of cells of the second main cell array, or a number obtained by summing a total number of the cells of the first main cell array, a total number of the cells of the first spare cell array, a total number of the cells of the second main cell array, and a total number of the cells of the second spare cell array and dividing the number obtained by 2, wherein the first main internal address and the second main internal address have the same bits except for an uppermost one bit, and the first spare internal address and the second spare internal address have the same bits except for an uppermost one bit, and the first main internal address and the first spare internal address have the same bits except for one bit; and wherein the internal addresses comprises the first main internal address, the first spare internal address, the second main internal address, and the second spare internal address; and wherein the first main internal address and the first spare internal address is consecutive across the first main cell array and the first spare cell array, and the second main internal address and second spare internal address is consecutive across the second main cell array and the second spare cell array, and the first spare internal address and the second main internal address is non-consecutive across the first spare cell array and the second main cell array.

7. The method of claim 6, further comprises comparing an external address with a value of a threshold address, which distinguishes the first main and the first spare cell arrays from the second main and the second spare cell arrays.

8. The method of claim 7, wherein the value of a threshold address is selected from a group comprising:

a value corresponding to a number obtained by summing the total number of the cells of the first main cell array and the total number of the cells of the first spare cell array, a value corresponding to a number obtained by summing the total number of the cells of the second main cell array and the total number of the cells of the second spare cell array, and a value corresponding to a number obtained by summing the total number of the cells of the first main cell array, the total number of the cells of the first spare cell array, the total number of the cells of the second main cell array, and the total number of the cells of the second spare cell array and dividing the number obtained by 2.

9. The method of claim 6, further comprising:

sequentially counting a counting address from a value of the internal addresses for access to the memory cell array;

deciding whether the counting address has the same value as a value corresponding to a last cell of the first spare cell array to produce a first decision result;

adjusting the value of the counting address to a value corresponding to an initial cell of the second main cell array based on the first decision result and performing the counting process continuously; and deciding whether the counting address has the same value as a value corresponding to a last cell of the second spare cell array based on the first decision result to produce a second decision result and performing the counting process continuously based on the second decision result.

10. The method of claim 9, wherein, when the counting address is the same as the value corresponding to the last cell of the first spare cell array, the adjusting of the counting address into a value corresponding to the initial cell of the second main cell array is performed, and when the counting address is different from the value corresponding to the last cell of the first spare cell array, the deciding of whether the counting address has the same value as the value corresponding to the last cell of the second spare cell array is performed.

11. The method of claim 10, wherein when the counting address has the same value as the value corresponding to the last cell of the second spare cell array, the sequential counting of the value of the internal addresses and the outputting of the counting address are brought to a halt, and when the counting address has a different value from the value corresponding to the last cell of the second spare cell array, the sequential counting of the value of the internal addresses and the outputting of the counting address are performed continuously.

12. A semiconductor memory device comprising:

a memory cell array configured to include at least two groups of cell arrays, wherein each of the groups is disposed in a sequential manner relative to other groups starting from a first sequential group, each of the groups are of substantially the same structure to other groups, each of the cell arrays are sequential within each group and each of the groups is configured to include a main cell array and a spare cell array; and a first group comprises a first main cell array and a first spare cell array and a second group comprises a second main cell array and a second spare cell array;

an address mapping unit configured to add a given value to the external address to produce a calculation result number, mapping the calculation result number as a second main internal address when the external address indicates the second main cell array, mapping the calculation result number as a second spare internal address when the external address indicates the second spare cell array, mapping the external address as a first main internal address when the external address indicates the first main cell array and mapping the external address as a first spare internal address when the external address indicates the first spare cell array;

wherein the given value is a value corresponding to one of a number obtained by subtracting a total number of the cells of the first spare cell array from a total number of cells of the first main cell array, a number obtained by subtracting a total number of the cells of the second spare cell array from a total number of cells of the second main cell array, or a number obtained by subtracting a sum of a total number of cells of the first spare cell array and a total number of cells of the second spare cell array from a sum of a total number of cells of the first main cell array and a total number of cells of the second main cell array and dividing the number obtained by 2, wherein the first main internal address and the second main internal address have the same bits except for an uppermost one bit, the first spare internal address and the second spare internal address have the same bits except for an uppermost one bit, and the first main internal address and the first spare internal address have the same bits except for one bit; and wherein the external address is inputted in consecutive manner as a whole for the memory cell array, internal addresses are arranged in consecutive manner for each of the groups in the memory cell array, and access to the memory cell array is based on the internal addresses, and wherein the internal addresses of the cell arrays included in each of the at least two groups of cell arrays are consecutive, and the internal addresses of one of cell arrays of the first group of the at least two groups and the internal addresses of one of cell arrays of the second group of the at least two groups are nonconsecutive.

13. The semiconductor memory device of claim 12, further comprising a counting unit configured to consecutively count a counting address from a value of the internal addresses indicating a cell of the first group to a value corresponding to a last cell of the first group for access to the memory cell array.

14. The semiconductor memory device of claim 13, wherein the counting unit performs the count operation to a preset number of the groups in the memory cell array.

* * * * *